United States Patent
Kim et al.

(10) Patent No.: US 12,538,732 B2
(45) Date of Patent: Jan. 27, 2026

(54) SUBSTRATE PROCESSING APPARATUS AND SUBSTRATE PROCESSING METHOD

(71) Applicant: WONIK IPS CO., LTD., Pyeongtaek-si (KR)

(72) Inventors: Min Su Kim, Osan-si (KR); Sang Jun Park, Yongin-si (KR); Ju Hwan Park, Hwaseong-si (KR); Byung Chul Cho, Hwaseong-si (KR); Kwang Seon Jin, Osan-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 395 days.

(21) Appl. No.: 18/086,366

(22) Filed: Dec. 21, 2022

(65) Prior Publication Data
US 2023/0343609 A1    Oct. 26, 2023

(30) Foreign Application Priority Data

Apr. 26, 2022    (KR) .......................... 10-2022-0051602

(51) Int. Cl.
| | | |
|---|---|---|
| H01L 21/67 | (2006.01) | |
| H01L 21/02 | (2006.01) | |
| H01L 21/311 | (2006.01) | |
| H01L 21/673 | (2006.01) | |

(52) U.S. Cl.
CPC .. *H01L 21/67069* (2013.01); *H01L 21/02164* (2013.01); *H01L 21/0217* (2013.01); *H01L 21/31116* (2013.01); *H01L 21/67248* (2013.01); *H01L 21/67326* (2013.01)

(58) Field of Classification Search
None
See application file for complete search history.

(56) References Cited

U.S. PATENT DOCUMENTS

| 9,842,744 | B2 | 12/2017 | Zhang et al. |
| 2017/0069466 | A1* | 3/2017 | Tran ................. H01L 21/67069 |
| 2019/0043732 | A1* | 2/2019 | Eason .................... H10B 43/27 |
| 2021/0111033 | A1* | 4/2021 | Korolik ............ H01J 37/32633 |

FOREIGN PATENT DOCUMENTS

KR    101903751 B1    10/2018

* cited by examiner

*Primary Examiner* — Stephanie P Duclair
(74) *Attorney, Agent, or Firm* — WILLIAM PARK AND ASSOCIATES LTD.

(57) ABSTRACT

A substrate processing method using a substrate processing apparatus which comprises a process chamber in which a reaction space is formed to process a substrate in which a composite layer pattern having a plurality of first insulating layers and a plurality of second insulating layers alternately stacked thereon is formed, a substrate support unit, a gas distribution unit, and a plasma reactor, the method comprising the steps of: heating the substrate support unit and the gas distribution unit such that a temperature of the gas distribution unit is maintained equal to or lower than a temperature of the substrate support unit; supplying a reactive gas including a halogen-containing gas to the plasma reactor; generating radicals by applying power to the plasma reactor to activate the halogen-containing gas; and at least partially etching the plurality of first insulating layers in a lateral direction selectively with respect to the plurality of second insulating layers by supplying the radicals onto the substrate mounted on the substrate support unit through the gas distribution unit.

7 Claims, 13 Drawing Sheets

| Gas | TC at 300K (W/Mk) |
|---|---|
| Air | 0.026 |
| Ar | 0.018 |
| H | 0.182 |
| He | 0.151 |
| $N_2$ | 0.026 |
| Ne | 0.049 |
| $O_2$ | 0.027 |
| CO | 0.025 |
| $CO_2$ | 0.017 |

(a) 10 mm (b) 15 mm (c) 25 mm (d) 35 mm

SUBSTRATE PROCESSING APPARATUS AND SUBSTRATE PROCESSING METHOD

CROSS-REFERENCE TO RELATED APPLICATION(S)

This application claims the priority under 35 USC § 119(a) to Korean Patent Application No. 10-2022-0051602, filed on Apr. 26, 2022, in the Korean Intellectual Property Office, the entire disclosure of which is incorporated herein by reference for all purposes.

BACKGROUND

1. Field

The following description relates to semiconductor manufacturing, and more particularly, to a substrate processing apparatus and a substrate processing method.

2. Description of Related Art

In the manufacture of a semiconductor device, various processes are performed in a substrate processing apparatus in a vacuum atmosphere. For example, processes such as loading a substrate into a process chamber, depositing a thin film on the substrate, and etching the thin film may be performed. Here, the substrate is supported by a substrate support unit installed in the process chamber, and process gas may be injected to the substrate through a gas distribution unit installed above the substrate support unit.

When one or a plurality of thin-film patterns are formed on the substrate, a plurality of thin films may be exposed on the substrate. For example, insulating films, such as a silicon oxide film, a silicon nitride film, and the like, may be exposed on the substrate. Then, a process of selectively etching one of the exposed insulating films may be additionally performed. Recently, with the high integration of a semiconductor device, the insulating films become thinner, resulting in a problem in that unintended insulating films are etched due to the lack of selectivity during the etching process. Furthermore, the thin insulating films make it difficult for etchant to enter the films, and thus wet etching is restricted.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a substrate processing apparatus and a substrate processing method, which enable dry etching having a high etch selectivity in the manufacture of a highly integrated device.

In one general aspect, there is provided a substrate processing method using a substrate processing apparatus which includes a process chamber in which a reaction space is formed to process a substrate in which a composite layer pattern having a plurality of first insulating layers and a plurality of second insulating layers alternately stacked thereon is formed, a substrate support unit coupled to the process chamber to support the substrate, a gas distribution unit coupled to an upper portion of the process chamber to face the substrate support unit, and a plasma reactor disposed outside the process chamber and connected to the gas distribution unit, the substrate processing method including the steps of: heating the substrate support unit and the gas distribution unit such that a temperature of the gas distribution unit is maintained equal to or lower than a temperature of the substrate support unit; supplying a reactive gas including a halogen-containing gas to the plasma reactor; generating radicals by applying power to the plasma reactor to activate the halogen-containing gas; and at least partially etching the plurality of first insulating layers in a lateral direction selectively with respect to the plurality of second insulating layers by supplying the radicals onto the substrate mounted on the substrate support unit through the gas distribution unit.

In the substrate processing method, in order to improve etching uniformity of the first insulating layers at a top portion and the first insulating layers at a bottom portion among the plurality of first insulating layers in the composite layer pattern, the temperature of the gas distribution unit may be maintained lower than the temperature of the substrate support unit in the heating step.

In the substrate processing method, the temperature of the substrate support unit may be maintained above room temperature and below 110° C., and the temperature of the gas distribution unit may be maintained above room temperature and below 70° C.

In the substrate processing method, the temperature of the substrate support unit may be maintained above room temperature and at 80° C. or less, and the temperature of the gas distribution unit may be maintained above room temperature and at 50° C. or less.

In the substrate processing method, the reactive gas may include an inert gas together with the halogen-containing gas and may not include a hydrogen-containing gas.

In the substrate processing method, the reactive gas may include $NF_3$ gas and Ar gas only.

In the substrate processing method, in the etching step, a gap distance between the gas distribution unit and the substrate support unit may be greater than 25 mm.

In the substrate processing method, in the heating step, the temperature of the substrate support unit may be controlled by heating a first heater provided in the substrate support unit, and the temperature of the gas distribution unit may be controlled by heating a second heater provided in the gas distribution unit.

In the substrate processing method, the plurality of first insulating layers may include silicon nitride films and the plurality of second insulating layers may include silicon oxide films.

In another general aspect, there is provided a substrate processing apparatus including: a process chamber in which a reaction space is formed to process a substrate in which a composite layer pattern having a plurality of first insulating layers and a plurality of second insulating layers alternately stacked thereon is formed, a substrate support unit coupled to the process chamber to support the substrate, a gas distribution unit coupled to an upper portion of the process chamber to face the substrate support unit, a plasma reactor disposed outside the process chamber and connected to the gas distribution unit, and a control unit configured to control the substrate support unit, the gas distribution unit, and the plasma reactor, wherein the control unit is configured to control a temperature of the gas distribution unit to be maintained equal to or lower than a temperature of the substrate support unit, control the plasma generator to generate radicals by supplying a reactive gas including a halogen-containing gas to the plasma reactor and applying power to the plasma reactor to activate the halogen-containing gas, and control the gas distribution unit to at least partially etch the first insulating layers in a lateral direction selectively with respect to the second insulating layers by supplying the radicals onto the substrate mounted on the substrate support unit through the gas distribution unit.

In the substrate processing apparatus, in order to improve etching uniformity of the first insulating layers at a top portion and the first insulating layers at a bottom portion among the plurality of first insulating layers in the composite layer pattern, the control unit may control the temperature of the gas distribution unit to be maintained lower than the temperature of the substrate support unit.

In the substrate processing apparatus, the control unit may control the temperature of the substrate support unit to be maintained above room temperature and below 100° C. and control the temperature of the gas distribution unit to be maintained above room temperature and below 70° C.

In the substrate processing apparatus, the control unit may control the temperature of the substrate support unit to be maintained above room temperature and at 80° C. or less and control the temperature of the gas distribution unit to be maintained above room temperature and at 70° C. or less.

The substrate processing apparatus may include a first heater provided in the substrate support unit and a second heater provided in the gas distribution unit, and the control unit may control the temperature of the substrate support unit and the gas distribution unit by using the first heater and the second heater.

In the substrate processing apparatus, the control unit may control a gap distance between the gas distribution unit and the substrate support unit to be greater than 25 mm during etching of the plurality of first insulating layers.

Other features and aspects will be apparent from the following detailed description, the drawings, and the claims.

BRIEF DESCRIPTION OF THE DRAWINGS

FIG. 7 is a table showing thermal conductivity characteristics according to the type of reactive gas in a substrate processing method according to some embodiments of the present disclosure.

Figure 1:
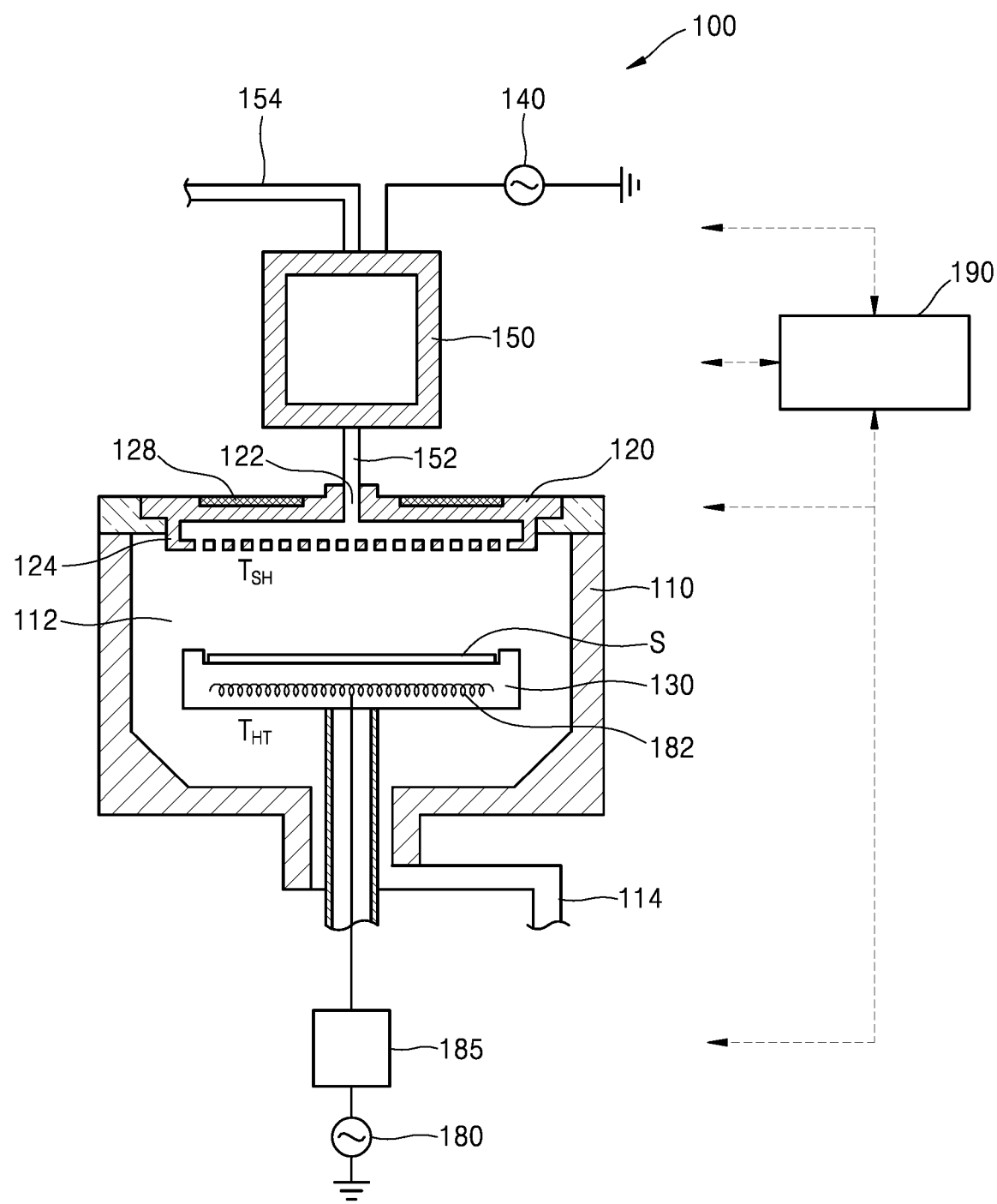
FIG. 1 is a schematic diagram illustrating a substrate processing apparatus according to an embodiment of the present disclosure.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, preferred embodiments of the present disclosure will be described in detail with reference to the accompanying drawings.

The embodiments of the present disclosure are provided for more fully describing the present disclosure to those skilled in the art, and the embodiments below may be modified in various forms, and the scope of the present disclosure is not limited to the embodiments below. Rather, these embodiments are provided such that this disclosure will be thorough and complete and will fully convey the spirit of the present invention to those skilled in the art. Also, thickness or sizes of layers in the drawings are exaggerated for convenience of explanation and clarity.

FIG. 1 is a schematic diagram illustrating a substrate processing apparatus 100 according to an embodiment of the present disclosure.

Referring to FIG. 1, a substrate processing apparatus 100 may include a process chamber 110, a gas distribution unit 120, a substrate support unit 130, a plasma reactor 150, and a control unit 190.

More specifically, a reaction space 112 in which a substrate S may be processed may be formed in the process chamber 110. The process chamber 110 may be connected to a vacuum pump (not shown) through a discharge pipe 114 to form a vacuum atmosphere. Further, the process chamber 110 may include an entrance for loading or unloading the substrate S into or from the reaction space 112 and a gate structure (not shown) for opening and closing the entrance. The process chamber 110 may be provided in various shapes, and may include, for example, a sidewall portion defining the reaction space 112 and a cover portion located at the top of the sidewall portion, for example, a top lead.

The gas distribution unit 120 may be coupled to the process chamber 110 to supply a process gas supplied from the outside of the process chamber 110. More specifically, the gas distribution unit 120 may be coupled to the process chamber 110, facing the substrate support unit 130. For example, the gas distribution unit 120 may be installed at an upper portion of the process chamber 110 to distribute a process gas onto the substrate S mounted on the substrate support unit 130.

In some embodiments, the gas distribution unit 120 may include an inlet 122 through which the process gas is introduced through the gas pipe 152 and a distribution plate 124 to distribute the process gas, which is introduced through the inlet 122 and dispersed inside of the gas distribution unit 120, into the reaction space 112. Furthermore, the gas distribution unit 120 may further include a blocker plate for dispersing the process gas passing through the inlet 122.

In some embodiments, the gas distribution unit 120 may be in various forms, such as in the form of a shower head, in a nozzle form, and the like. When the gas distribution unit 120 is in the form of a shower head, the gas distribution unit 120 may be coupled to the process chamber 110 in the form that partially covers the upper portion of the process chamber 110. For example, the gas distribution unit 120 may be coupled to the cover portion or the top lead of the process chamber 110.

The substrate support unit 130 may be coupled to the process chamber 110 to support the substrate S in the reaction space 112. For example, the substrate support unit 130 may be installed in the process chamber 110, facing the gas distribution unit 120. Further, the substrate support unit 130 may be provided with a heater 182 for heating the substrate S. For example, the heater 182 may be provided within the substrate support unit 130. A heater power source 180 may be connected to the heater 182 to apply power to the heater 182, and additionally, a radio frequency (RF) filter 185 may be interposed between the heater 182 and the heater power source 180.

Although the shape of an upper plate of the substrate support unit 130 may generally correspond to the shape of the substrate S, it is not limited thereto and may be provided in a variety of shapes that are larger than the substrate S so that the substrate S can be stably mounted. In one example, a shaft of the substrate support unit 130 may be connected to an external motor (not shown) to be able to move up and down. In this case, a bellows pipe (not shown) may be connected thereto to maintain the airtightness. Further, since the substrate support unit 130 is configured to house the substrate S thereon, it may also be referred to as a substrate seating portion, a susceptor, or the like.

In some embodiments, the substrate support unit 130 may further include an electrostatic electrode for applying an electrostatic force to the substrate S to fix the substrate S thereon. In this case, the electrostatic electrode may be provided with DC power from an electrostatic power supply unit (not shown).

The plasma reactor 150 may be disposed outside the process chamber 110 to be connected to the gas distribution unit 120. The plasma reactor 150 may be connected to the gas distribution unit 120 through the gas pipe 152. Further, a process gas may be introduced into the plasma reactor 150 through the gas pipe 154. The plasma reactor 150 may be referred to as a remote plasma reactor or a remote plasma generator in that it is disposed outside the process chamber 110.

Further, the plasma reactor 150 may be connected to a plasma power source unit 140 for applying power to the plasma reactor 150. For example, the plasma power source unit 140 may include at least one RF power to apply at least one RF power to the process chamber 110. The plasma reactor 150 may form a plasma atmosphere using an inductively coupled plasma (ICP) method, a capacitively coupled plasma (CCP) method, a toroidal plasma method, a microwave (MW) method, etc.

The plasma reactor 150 may be supplied with at least one process gas through the gas pipe 154 and may receive plasma power to form a plasma atmosphere therein, thereby activating the reactive gas to form radicals. The radicals may be provided to the gas distribution unit 120 through the gas pipe 152 and be distributed onto the substrate S through the gas distribution unit 120. In some embodiments, the gas distribution unit 120 may be supplied separately with additional process gas without passing through the plasma reactor 150.

In some embodiments, the gas distribution unit 120 may be provided with a heating means, for example, a heater 128. Accordingly, the temperature of the gas distribution unit 120 may be controlled by the heater 128. The heater 128 may include various types of heating means, such as a cartridge heater, a heating wire heater, a heat exchanger, an infrared heater, a laser heater, and the like.

Hereinafter, for convenience of distinction, the heater 182 provided in the substrate support unit 130 may be referred to as a first heater 182, and the heater 128 provided in the gas distribution unit 120 may be referred to as a second heater 128.

The control unit 190 may control the operation of the substrate processing apparatus 100, for example, the operations of the plasma reactor 150, the gas distribution unit 120, the substrate support unit 130, and the like. For example, the control unit 190 may control the temperature $T_{SH}$ of the gas distribution unit 120 and the temperature $T_{HT}$ of the substrate support unit 130, control the application of plasma power and supply of process gas to the plasma reactor 150, and control the supply of gas through the gas distribution unit 120.

For example, the control unit 190 may control the temperature $T_{HT}$ of the substrate support unit 130 and the temperature $T_{SH}$ of the gas distribution unit 120 using the first heater 182 and the second heater 128. In some embodiments, the control unit 190 may control the temperature $T_{SH}$ of the gas distribution unit 120 to be equal to or lower than the temperature $T_{HT}$ of the substrate support unit 130.

In some embodiments, the substrate processing apparatus 100 may be used as an etching apparatus or a preprocessing apparatus for etching a thin film of the substrate S. Hereinafter, a substrate processing method according to embodiments of the present disclosure will be described with reference to the substrate processing apparatus 100.

Figure 2:
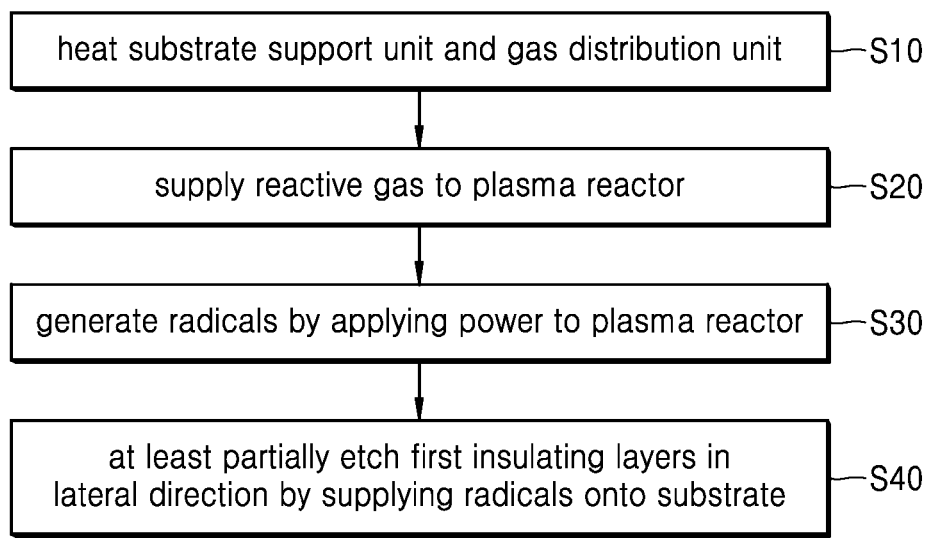
FIG. 2 is a flowchart illustrating a substrate processing method according to an embodiment of the present disclosure.
Figure 3A:
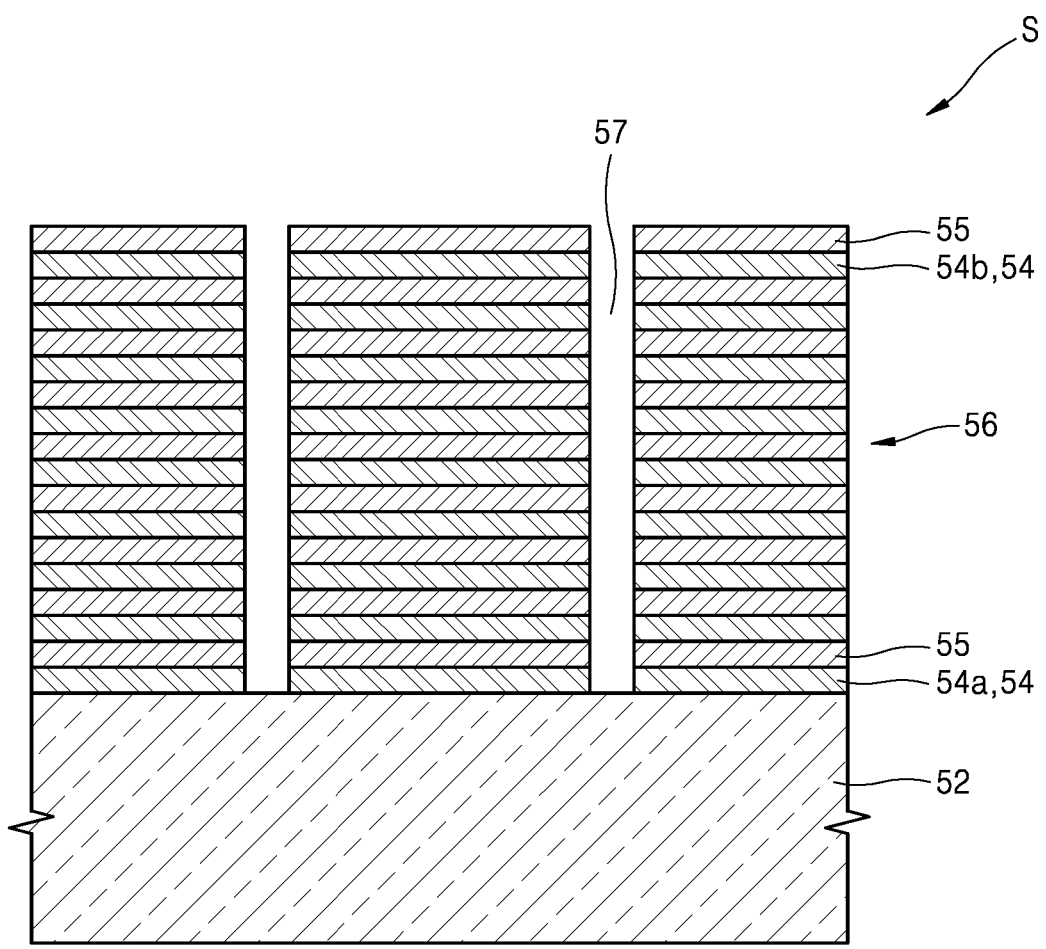
FIGS. 3A and 3B are schematic cross-sectional views of a substrate showing a substrate processing method according to some embodiments of the present disclosure.
Figure 3B:
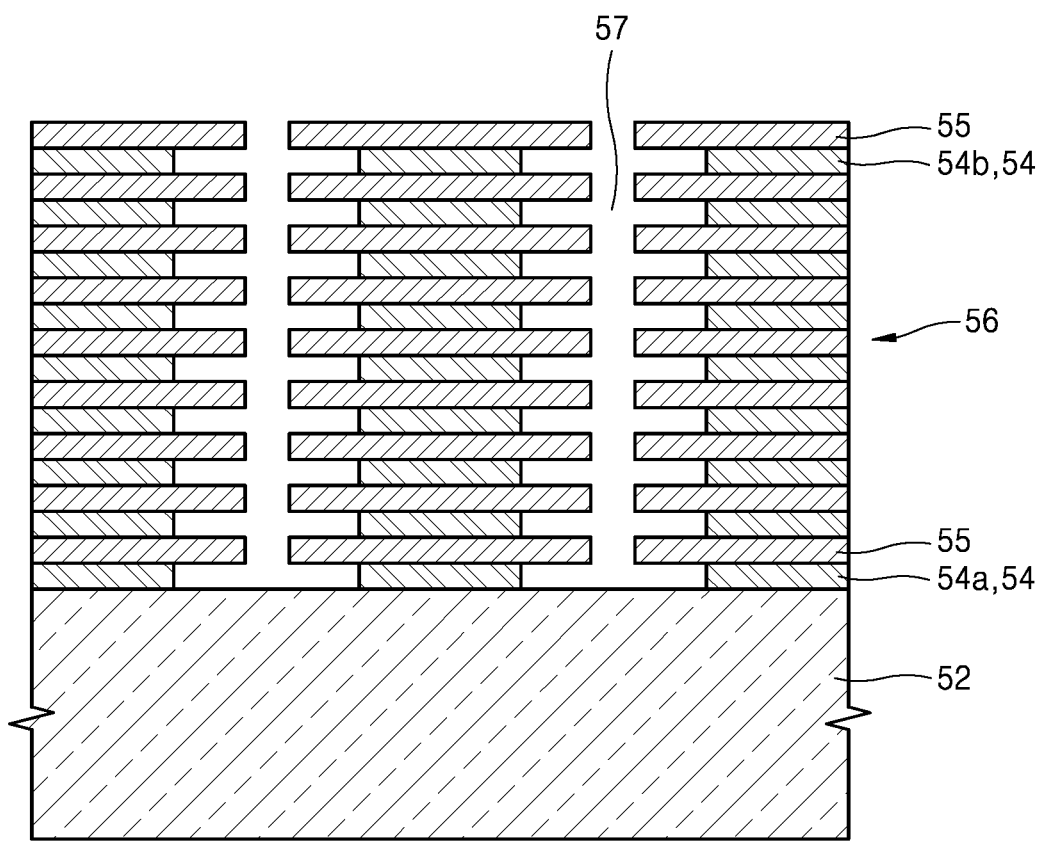

FIG. 2 is a flowchart illustrating a substrate processing method according to an embodiment of the present disclosure, and FIGS. 3A and 3B are schematic cross-sectional views of a substrate showing the substrate processing method according to some embodiments of the present disclosure.

Referring to FIG. 3A, a composite layer pattern 56 may be formed on the substrate S. For example, the substrate S may include a semiconductor wafer 52, and a structure for forming a semiconductor device may be formed on the semiconductor wafer 52. More specifically, the composite layer pattern 56 may be formed on the semiconductor wafer 52. The semiconductor wafer 52 may include a single-crystalline semiconductor material, such as silicon, germanium, silicon-germanium, and the like, and may further include a semiconductor epitaxial layer and the like.

The composite layer pattern 56 may include a pattern structure in which a plurality of first insulating layers 54 and a plurality of second insulating layers 55 are alternately stacked on each other. The first insulating layers 54 and the second insulating layers 55 may be alternately stacked on each other and patterned using photolithography and etching techniques to form a plurality of trenches 57. For example, the first insulating layers 54 may include silicon nitride films, and the second insulating layers 55 may include silicon oxide films.

Referring to FIGS. 1, 2, and 3A, in some embodiments, the substrate S may be processed using the substrate processing apparatus 100. For example, the substrate S may be processed while mounted on the substrate support unit 130 in the process chamber 110. More specifically, steps of introducing the substrate S into the process chamber 110 and mounting the substrate S onto the substrate support unit 130 may be performed.

Referring to FIGS. 1, 2, and 3B, according to the substrate processing method in accordance with this embodiment, the substrate support unit 130 and the gas distribution unit 120 are heated (S10), and the reactive gas is supplied into the plasma reactor 150 (S20), power is applied to the plasma reactor 150 to generate radicals (S30), and the radicals are supplied onto the substrate S to at least partially etch the first insulating layers 54 in the lateral direction (S40).

For example, the control unit 190 may control the temperature $T_{SH}$ of the gas distribution unit 120 to be equal to or lower than the temperature $T_{HT}$ of the substrate support unit 130 (S10), control the plasma reactor 150 to generate radicals by supplying a reactive gas including a halogen-containing gas to the plasma reactor 150 (S20) and applying power to the plasma reactor 150 to activate the halogen-containing gas (S30), and control the gas distribution unit 120 to at least partially etch the first insulating layers 54 in the lateral direction selectively with respect to the second insulating layers 55 by supplying the radicals onto the substrate S mounted on the substrate support unit 130 through the gas distribution unit 120.

More specifically, the aforementioned heating step (S10) may be performed by heating the substrate support unit 130 and the gas distribution unit 120 such that the temperature $T_{SH}$ of the gas distribution unit 120 is maintained equal to or lower than the temperature $T_{HT}$ of the substrate support unit 130. For example, in the heating step (S10), the temperature $T_{HT}$ of the substrate support unit 130 may be controlled by heating the first heater 182 in the substrate support unit 130, and the temperature $T_{SH}$ of the gas distribution unit 120 may be controlled by heating the second heater 128 in the gas distribution unit 120. Meanwhile, the wall temperature of the process chamber 110 may be controlled to be similar to the temperature $T_{SH}$ of the gas distribution unit 120.

In some embodiments, in order to improve etching uniformity of the first insulating layers 54b at the top portion and the first insulating layers 54a at the bottom portion among the first insulating layers 54 in the composite layer pattern 56, the temperature $T_{SH}$ of the gas distribution unit 120 may be maintained lower than the temperature $T_{HT}$ of the substrate support unit 130 in the heating step. The temperature $T_{HT}$ of the substrate support unit 130 and the temperature $T_{SH}$ of the gas distribution unit 120 may be controlled by the control unit 190.

The control of the temperature $T_{HT}$ of the substrate support unit 130 and the temperature $T_{SH}$ of the gas distribution unit 120 may affect etch selectivity of the first insulating layers 54 with respect to the second insulating layers 55. For example, when the first insulating layers 54 are silicon nitride films and the second insulating layers 55 are silicon oxide films, the halogen-containing gas, which is used as a reactive gas, may etch not only the silicon nitride films but also the silicon nitride films. However, as the temperature of the substrate S decreases, the etch rate of the silicon oxide films significantly decreases as compared to the silicon nitride films. Thus, in order to increase the etch selectivity, the temperature of the substrate S may be maintained below a predetermined temperature, for example, 110° C.

Meanwhile, as the height of the composite layer pattern 56 increases, the depth of the trenches 57 increases, and accordingly, a difference in etch rate may occur between the upper part and the lower part. In particular, the etch rate of the first insulating layers 54b at the top portion may be fast and the etch rate of the first insulating layers 54a at the bottom portion may be slow. Accordingly, in order to improve etching uniformity in a vertical direction, the temperature $T_{SH}$ of the gas distribution unit 120 close to the first insulating layers 54b at the top portion may be controlled to be lower than the temperature $T_{HT}$ of the substrate support unit 130 close to the first insulating layers 54a at the bottom portion.

The aforementioned heating step (S10) may be performed before the substrate S is mounted on the substrate support unit 130 or after the substrate S is mounted on the substrate support unit 130.

In addition, the step (S20) of supplying the reactive gas may be performed by supplying a reactive gas including halogen-containing gas to the plasma reactor 150. For example, the reactive gas may be supplied into the plasma reactor 150 through the gas pipe 154. The reactive gas may include a halogen-containing gas which is one selected from the group consisting of HF, $NF_3$, and $F_2$ gases, or a combination thereof. Further, the reactive gas may include an inert gas together with the halogen-containing gas. In some embodiments, the reactive gas may not include a hydrogen-containing gas such as $H_2$ or $NH_3$ gas in consideration of heat transfer efficiency.

In addition, in the step (S30) of generating radicals, radicals may be generated by applying power to the plasma reactor 150 through the plasma power source unit 140 to activate the halogen-containing gas. In this embodiment, when the reactive gas does not include a hydrogen-containing as and is composed of a halogen-containing gas and an inert gas, no new compound or salt may not be produced upon activation of the reactive gas, but the halogen-containing gas may be activated to form radicals.

In addition, in the etching step (S40), the radicals are supplied onto the substrate S mounted on the substrate support unit 130 through the gas distribution unit 120 so that the first insulating layers 54 may be at least partially etched in the lateral direction selectively with respect to the second insulating layers 55. For example, the radicals generated in the plasma reactor 150 may be supplied to the process chamber 110 through the gas pipe 152 and distributed onto the substrate S through the gas distribution unit 120.

In the etching step (S40), the first insulating layers 54 need to have a high etch selectivity with respect to the second insulating layers 55. That is, while the first insulating layers 54 are being etched, it is necessary that the second insulating layers 55 are not etched or are etched to a minimum. For example, the etch selectivity of the first insulating layers 54 to the second insulating layers 55 may be greater than 50:1.

The etching by radicals may induce isotropic etching as chemical dry etching. Accordingly, the radicals may be vertically supplied through the trenches 57, and then diffuse in the lateral direction to etch the first insulating layers 54 in the lateral direction to a predetermined depth. Thus, this etching method may allow isotropic etching to replace conventional wet etching and be performed as dry etching. Since the radicals may penetrate into a very narrow space compared to a wet etchant, the above-described etching method may allow the first insulating layers 54 in an extremely fine pattern to be selectively etched.

Meanwhile, as described above, the temperature control of the substrate S is required to increase the etch selectivity. Thus, the temperature of the reactive gas or the radicals may be controlled to control the substrate S, in addition to or independent of the heating of the substrate support unit 130 and the gas distribution unit 120. However, the temperature control of the substrate S by reactive gas or radicals may be limited in that it mainly affect only the surface of the composite layer pattern 56.

In some embodiments, the etching step (S40) may be performed by repeatedly supplying the radicals onto the substrate S through the gas distribution unit 120 one or more times at a predetermined period. For example, since the etching amount for the second insulating layers 55 may increase if the etching time increases, the etching step (S40) may be repeatedly performed a plurality of times at a predetermined period.

Hereinafter, process conditions in the substrate processing method using the substrate processing apparatus 100 will be described in further detail. In the following embodiments, the first insulating layers 54 are silicon nitride films, the second insulating layers are silicon oxide films, and a mixture gas of $NF_3$ and Ar is used as a reactive gas.

Figure 4A:
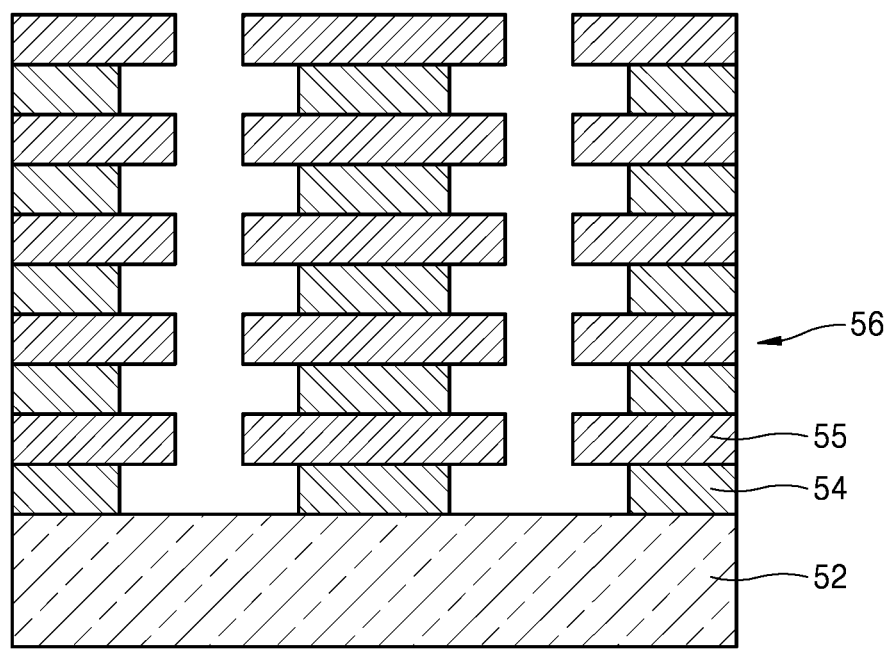
FIGS. 4A and 4B are conceptual cross-sectional views schematically showing etching profiles of a composite layer pattern according to the temperature of a substrate support unit and a gas distribution unit in a substrate processing method according to some embodiments of the present disclosure.
Figure 4B:
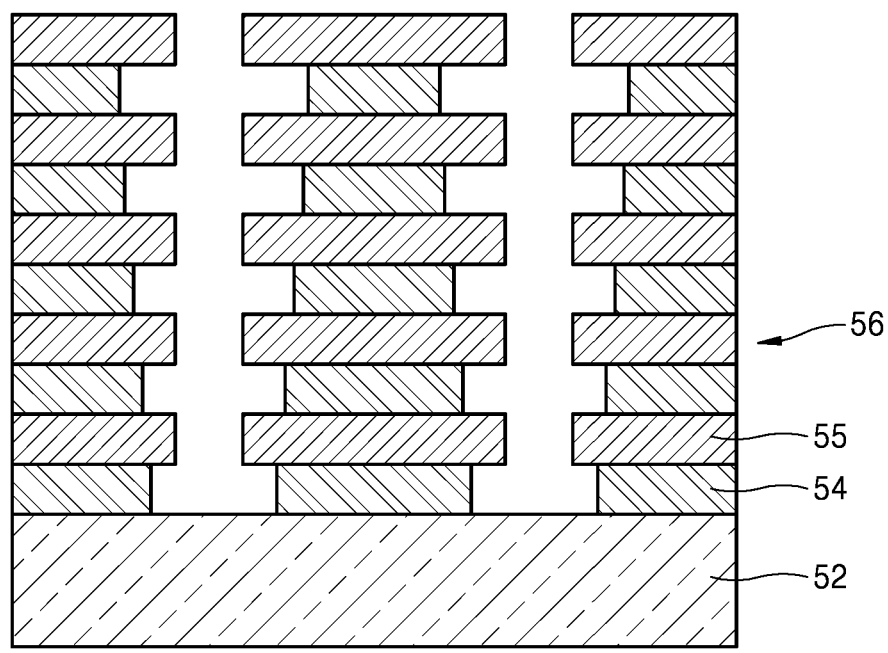

FIGS. 4A and 4B are conceptual cross-sectional views schematically showing etching profiles of a composite layer pattern 56 according to the temperature of the substrate support unit 130 and the gas distribution unit 120 in a substrate processing method according to some embodiments of the present disclosure. FIG. 4A illustrates an etching profile when the temperature $T_{SH}$ of the gas distribution unit 120 is equal to or lower than the temperature $T_{HT}$ of the substrate support unit 130, and FIG. 4 illustrates an etching profile when the temperature $T_{SH}$ of the gas distribution unit 120 is higher than the temperature $T_{HT}$ of the substrate support unit 130.

As shown in FIG. 4A, it can be seen that, when the temperature $T_{SH}$ of the gas distribution unit 120 is equal to or lower than the temperature $T_{HT}$ of the substrate support unit 130, the etching profiles are good throughout the first insulating layers 54. In contrast, as shown in FIG. 4B, it can be seen that, when the temperature $T_{SH}$ of the gas distribution unit 120 is higher than the temperature $T_{HT}$ of the substrate support unit 130, the etching profiles of the first insulating layers 54 are overall poor and the etching amount of the first insulating layers 54 decreases from top to bottom.

Figure 5:
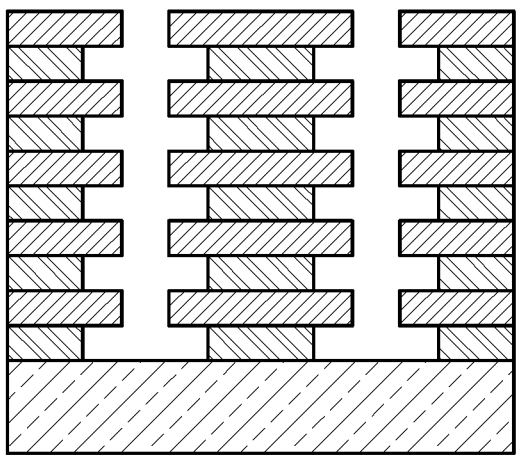
FIG. 5 illustrate conceptual cross-sectional views schematically showing an etching profile of a composite layer pattern according to the temperature of a substrate support unit in a substrate processing method according to some embodiments of the present disclosure.
Figure 5:
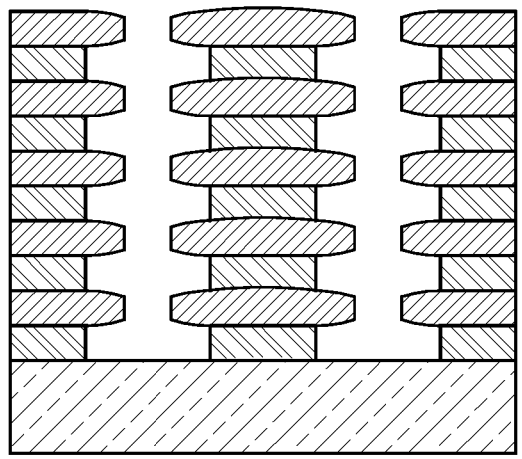
Figure 5:
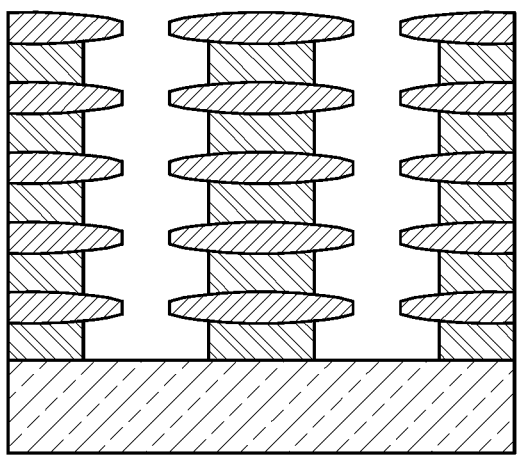
Figure 5:
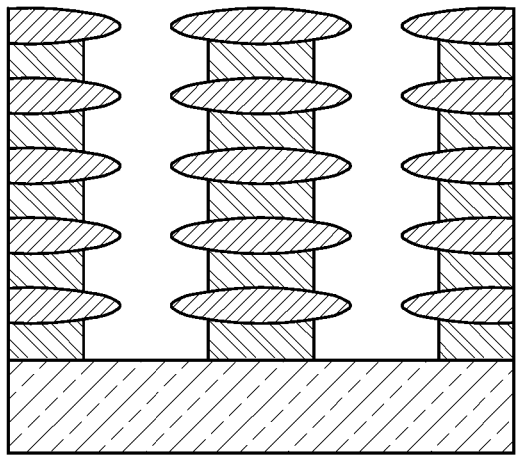

FIG. 5 illustrate conceptual cross-sectional views schematically showing etching profiles of a composite layer pattern according to the temperature of the substrate support unit 130 in a substrate processing method according to some embodiments of the present disclosure.

Referring to FIG. 5, in (d) in which the temperature $T_{HT}$ of the substrate support unit 130 is as high as 110° C., a needle shape is formed due to severe over etch and etch selectivity is poor, whereas in (a) to (c), the etching profiles become good as the temperature $T_{HT}$ of the substrate support unit 130 is lowered. Therefore, the temperature $T_{HT}$ of the substrate support unit 130 may be maintained at least below 110° C., specifically, at 80° C. or less, and more specifically, below 65° C. In some embodiments, the temperature $T_{HT}$ of the substrate support unit 130 may be maintained at least above room temperature and at 50° C. or less in order to ensure a certain level of etch rate and control convenience.

Figure 6:
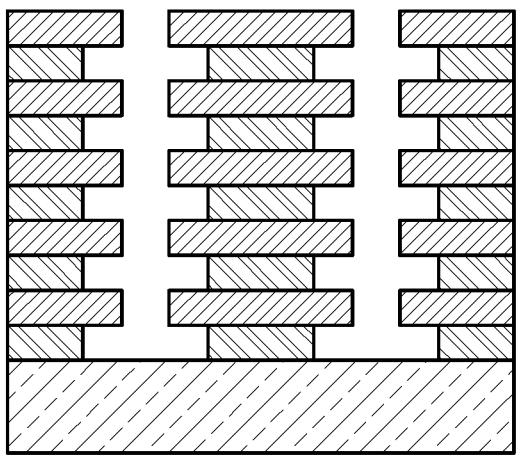
FIG. 6 illustrate conceptual cross-sectional views schematically showing etching profiles of a composite layer pattern according to the temperature of the gas distribution unit in a substrate processing method according to some embodiments of the present disclosure.
Figure 6:
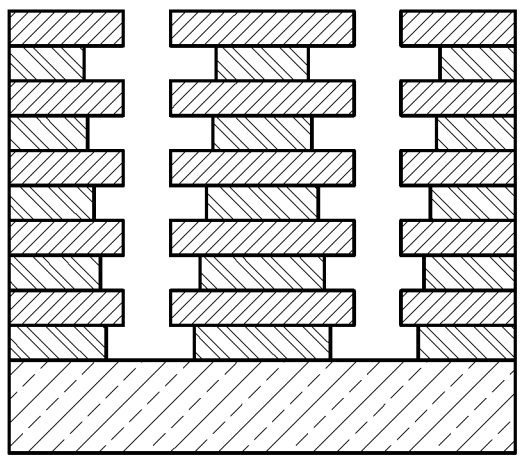
Figure 6:
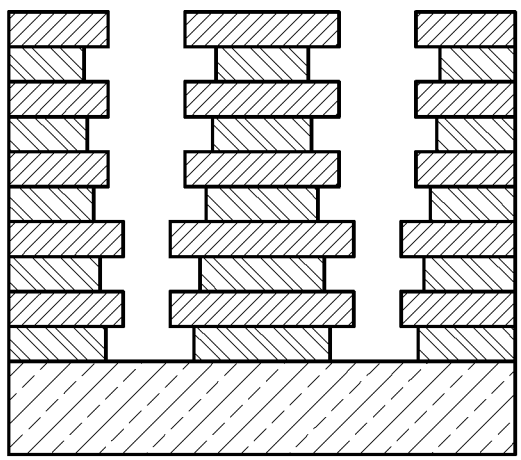
Figure 6:
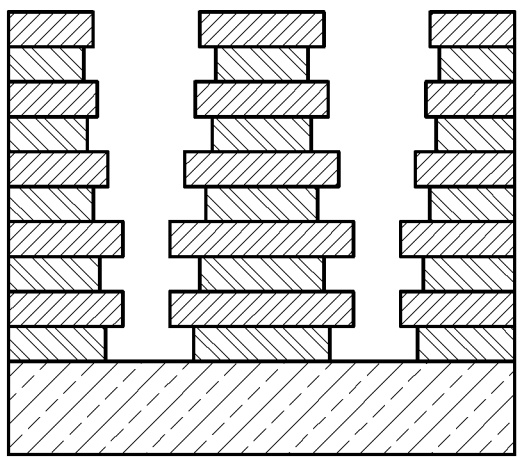

FIG. 6 illustrate conceptual cross-sectional views schematically showing etching profiles of a composite layer pattern according to the temperature of the gas distribution unit in a substrate processing method according to some embodiments of the present disclosure.

Referring to FIG. 6, as the temperature $T_{SH}$ of the gas distribution unit 120 increases, the upper and lower portions of the first insulating layers 54 are etched non-uniformly. More specifically, in (a) in which the temperature $T_{SH}$ of the gas distribution unit 120 is 30° C., the etching profiles of the first insulating layers 54 are good, in (b) in which the temperature $T_{SH}$ of the gas distribution unit 120 is 50° C., the etching amount starts to decrease toward the lower portion, and in (c) and (d) in which the temperature $T_{SH}$ of the gas distribution unit 120 is in the range of 70 to 90° C., the etching amount further decreases from the upper portion to the lower portion of the first insulating layers 54. Therefore, under these conditions, the temperature $T_{SH}$ of the gas distribution unit 120 may be maintained below 70° C., specifically, at 50° C. or less, and more specifically, below 50° C. The temperature $T_{SH}$ of the gas distribution unit 120 may be maintained at least above room temperature to ensure a certain level of etch rate and control convenience.

From the aforementioned results, for the etching uniformity of the composite layer pattern 56, the temperature $T_{HT}$ of the substrate support unit 130 may be maintained above room temperature and below 110° C., and the temperature $T_{SH}$ of the gas distribution unit 120 may be maintained above room temperature and below 70° C. Preferably, the temperature $T_{HT}$ of the substrate support unit 130 may be maintained above room temperature and at 80° C. or less, and the temperature $T_{SH}$ of the gas distribution unit 120 may be maintained above room temperature and at 50° C. or less. More preferably, the temperature $T_{HT}$ of the substrate support unit 130 may be maintained above room temperature and below 65° C., and the temperature $T_{SH}$ of the gas distribution unit 120 may be maintained above room temperature and below 50° C. The temperature control described above may be performed by the control unit 190.

FIG. 7 is a table showing thermal conductivity characteristics according to the type of reactive gas in a substrate processing method according to some embodiments of the present disclosure.

Referring to FIG. 7, there is a difference in thermal conductivity according to the type of reactive gas. When a reactive gas has high thermal conductivity, heat at high temperature of the plasma reactor 150 may be transferred to the substrate S through the reactive gas. As described above, the etch selectivity of the composite layer pattern 56 degrades when the temperature of the substrate S increases, and thus the thermal conductivity of the reactive gas needs to be low in order to prevent the heat of the plasma reactor 150 from being transferred to the substrate S.

Accordingly, a gas with low thermal conductivity needs to be selected as an inert gas which is used as a carrier gas because a halogen-containing gas used as an etchant is primarily determined. In this respect, argon (Ar) is beneficial compared to other carrier gases, for example, helium (He) gas, nitrogen ($N_2$) gas, neon (Ne) gas, and the like. On the other hand, a hydrogen (H) gas may be used as part of a reactive gas, but is disadvantageous in that it has high thermal conductivity. Therefore, in consideration of the thermal conductivity, the reactive gas may include an inert gas, for example, an argon (Ar) gas, together with a halogen-containing gas, but may not include a hydrogen-containing gas.

Figure 8A:
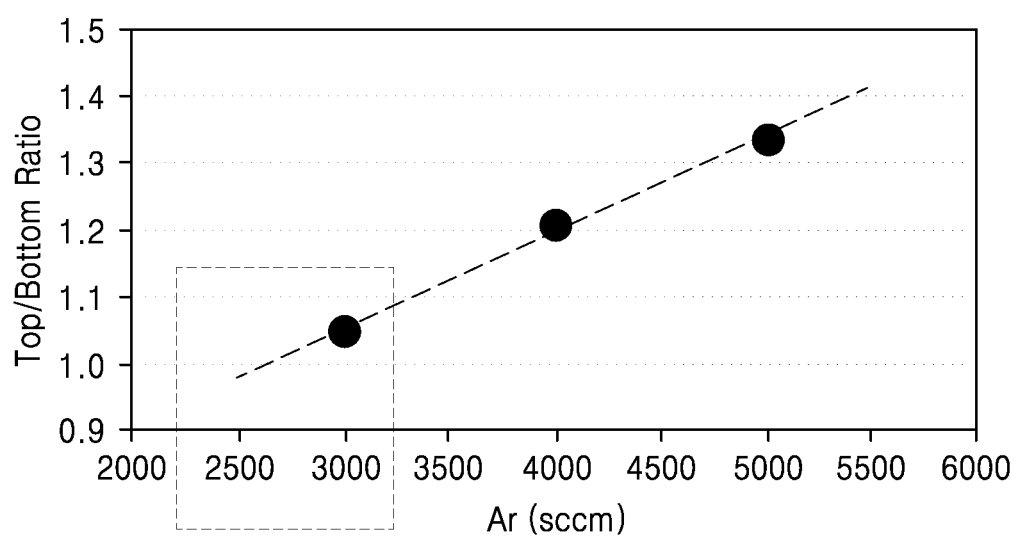
FIGS. 8A and 8B are graphs respectively showing an etch ratio of the top and bottom of a composite layer pattern according to the flow rates of argon (Ar) gas and $NF_3$ gas, which are one of the reactive gases, in a substrate processing method according to some embodiments of the present invention.
Figure 8B:
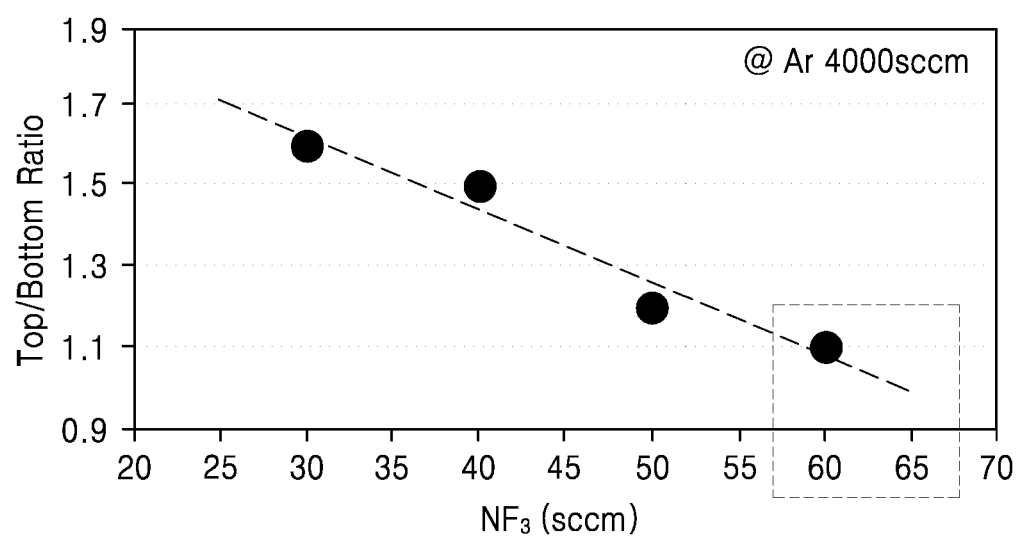

FIGS. 8A and 8B are graphs showing an etch ratio at the top and bottom of the composite layer pattern 56 according to flow rates of argon (Ar) gas flow rate and $NF_3$ gas, which are one of the reactive gases, respectively, in a substrate processing method according to some embodiments of the present disclosure.

As shown in FIG. 8A, the etch ratop of the top portion to the bottom portion increases as the flow rate of argon (Ar) gas increases, whereas, as shown in FIG. 8B, the etch ratop of the top portion to the bottom portion decreases as the flow rate of $NF_3$ gas increases. Thus, in order to maintain etching uniformity in the vertical direction under the above-described conditions, the flow rate of the argon (Ar) gas may be maintained at, for example, 3000 sccm or less, and the flow rate of the $NF_3$ gas may be maintained at, for example, 60 sccm or higher.

Figure 9:
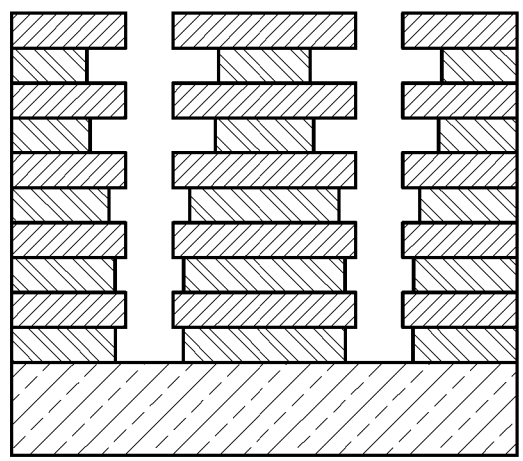
FIG. 9 is a schematic cross-sectional view showing an etching profile of a composite layer pattern when $NH_3$ gas is included as a reactive gas in a substrate processing method according to some embodiments of the present disclosure.

FIG. 9 is a schematic cross-sectional view showing an etching profile of the composite layer pattern 56 when $NH_3$ gas is included as a reactive gas in a substrate processing method according to some embodiments of the present disclosure.

Referring to FIG. 9, when $NH_3$ is included as a reactive gas, in addition to Ar and $NF_3$, etching uniformity in the vertical direction is very poor. Such a result may be due to high thermal conductivity of a hydrogen (H)-containing gas as described above. Moreover, the $NH_3$ gas may react with the $NF_3$ gas in the plasma reactor 150 to produce heavy polymers, such as $NH_4F$, $NH_4(HF)_x$, and the like, and these polymers may deteriorate the etching uniformity of the part of the composite layer pattern 56.

It is difficult to control the amount of the polymers to be formed, and these polymers are heavy and have a short mean free path, resulting in a short moving distance. Therefore, these polymers may not significantly affect the etching when an aspect ratio of the composite layer pattern 56 is not high. However, when the aspect ratio is high, the movement of the polymers to the lower portions of the trenches 57 is restricted, which results in etching failure. In particular, etching mainly occurs in the upper portion of the composite layer pattern 56, and the etch rate may be significantly reduced in the lower portion.

Accordingly, in consideration of this point, when the aspect ratio of the composite layer pattern 56 is high, the reactive gas may be composed only of $NF_3$ gas and Ar gas, excluding $NH_3$ gas.

Figure 10:
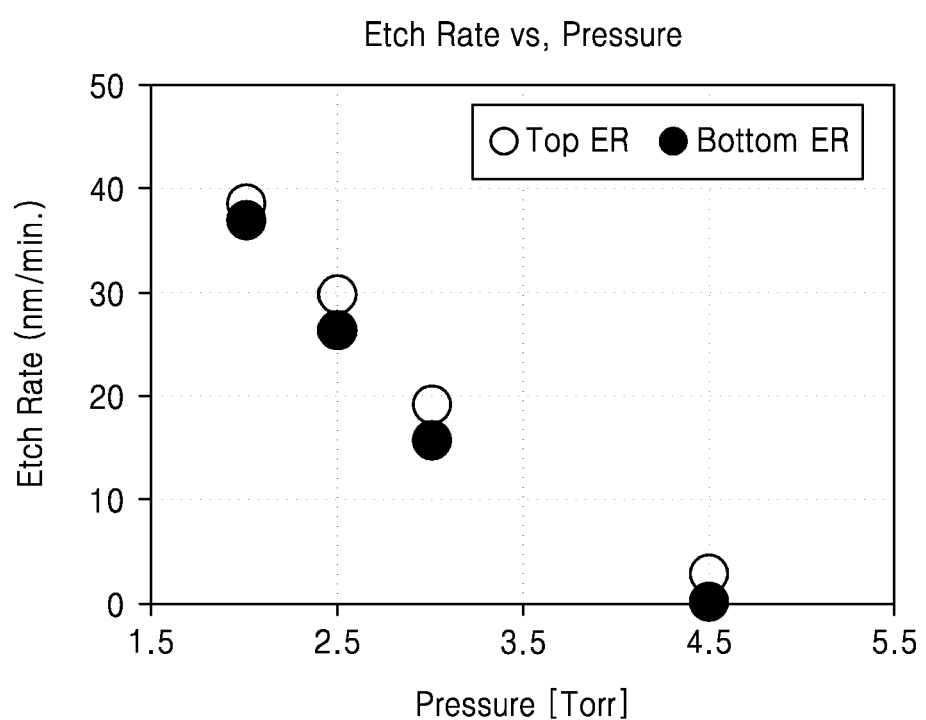
FIG. 10 is a graph showing etch rates at the top portion and the bottom portion of a composite layer pattern according to the pressure in a process chamber in a substrate processing method according to some embodiments of the present disclosure.

FIG. 10 is a graph showing etch rates at the top portion and the bottom portion of the composite layer pattern 56 according to the pressure in the process chamber 110 in a substrate processing method according to some embodiments of the present disclosure.

Referring to FIG. 10, as the pressure of the process chamber 110 increases, the etch rate is greatly reduced. This may be construed due to the fact that as the pressure increases, the production rate of radicals decreases and the mean free path of radicals becomes short. Thus, in order to achieve a suitable etch rate under these conditions, the pressure of the process chamber 110 may be maintained at a predetermined pressure or less, for example, 2.5 Torr or less, more strictly, 2.0 Torr or less.

Figure 11:
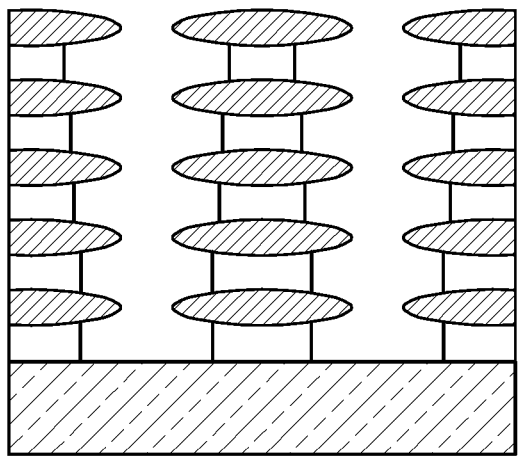
FIG. 11 illustrates conceptual cross-sectional views showing an etching profile of a composite layer pattern according to a gap distance between a substrate support unit 130 and a gas distribution unit in a substrate processing method according to some embodiments of the present disclosure.
Figure 11:
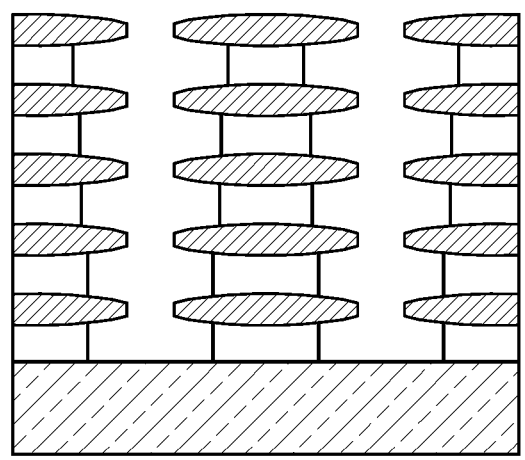
Figure 11:
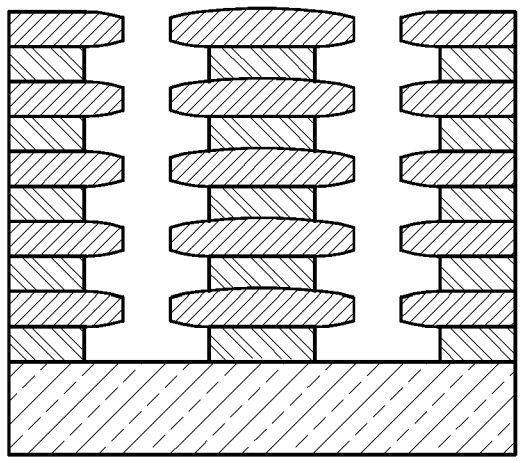
Figure 11:
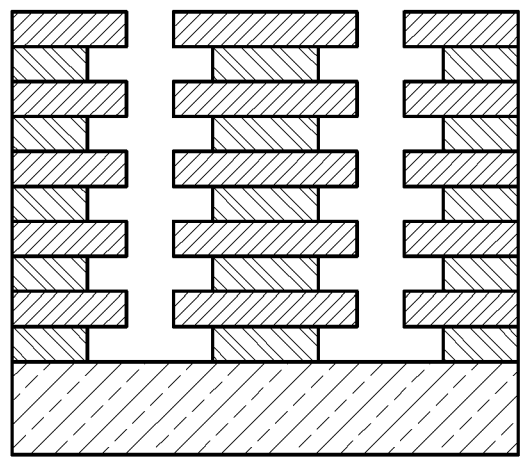

FIG. 11 illustrates conceptual cross-sectional views showing the etching profile of the composite layer pattern 56 according to a gap distance between the substrate support unit 130 and the gas distribution unit 120 in a substrate processing method according to some embodiments of the present disclosure.

Referring to FIG. 11, it can be seen that etching failure occurs as the gap distance between the substrate support unit 130 and the gas distribution unit 120 decreases during the process. More specifically, in (a) and (b) in which the gap distance between the substrate support unit 130 and the gas distribution unit 120 is 15 mm or less, the etching profile is very poor, but in (c) in which the gap distance is 25 mm, the etching profile is somewhat poor, but acceptable, and in (d) in which the gap distance is 35 mm, the etching profile is very good. Thus, in order to achieve acceptable etching profile under this condition, the gap distance between the substrate support unit 130 and the gas distribution unit 120 may be maintained greater than 25 mm, more strictly 35 mm or greater.

As described above, when the first insulating layers 54 are etched in the lateral direction in the composite layer pattern 56 of a high aspect ratio, suitable process conditions may be used during chemical dry etching using radicals to obtain uniform etching profiles with a high etch selectivity. Accordingly, a semiconductor device having a vertical structure may be reliably formed along the composite layer pattern 56 thereafter.

According to the above-described substrate processing method according to some embodiments of the present disclosure, a high etch selectivity may be accomplished in the insulating film etching process during the manufacture of a highly-integrated device. However, the scope of the present disclosure is not limited by the above effect.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

REFERENCE NUMERALS

100: SUBSTRATE PROCESSING APPARATUS
110: PROCESS CHAMBER
120: GAS DISTRIBUTION UNIT
130: SUBSTRATE SUPPORT UNIT
140: PLASMA POWER SOURCE
150: PLASMA REACTOR
190: CONTROL UNIT

What is claimed is:

1. A substrate processing method using a substrate processing apparatus which comprises a process chamber in which a reaction space is formed to process a substrate in which a composite layer pattern having a plurality of first insulating layers and a plurality of second insulating layers alternately stacked thereon is formed, a substrate support unit coupled to the process chamber to support the substrate, a gas distribution unit coupled to an upper portion of the process chamber to face the substrate support unit, and a plasma reactor disposed outside the process chamber and connected to the gas distribution unit, the substrate processing method comprising the steps of:

heating the substrate support unit and the gas distribution unit such that a temperature of the gas distribution unit is maintained equal to or lower than a temperature of the substrate support unit;

supplying a reactive gas including a halogen-containing gas to the plasma reactor;

generating radicals by applying power to the plasma reactor to activate the halogen-containing gas; and at least partially etching the plurality of first insulating layers in a lateral direction selectively with respect to the plurality of second insulating layers by supplying the radicals onto the substrate mounted on the substrate support unit through the gas distribution unit, wherein the plurality of first insulating layers comprise silicon nitride films and the plurality of second insulating layers comprise silicon oxide films, in order to improve etching uniformity of the first insulating layers at a top portion and the first insulating layers at a bottom portion among the plurality of first insulating layers in the composite layer pattern, the temperature of the gas distribution unit close to the top portion of the first insulating layers is maintained lower than the temperature of the substrate support unit close to the bottom portion of the first insulating layers in the heating step.

2. The substrate processing method of claim 1, wherein the temperature of the substrate support unit is maintained above room temperature and below 110° C. and the temperature of the gas distribution unit is maintained above room temperature and below 70° C.

3. The substrate processing method of claim 2, wherein the temperature of the substrate support unit is maintained above room temperature and at 80° C. or less and the temperature of the gas distribution unit is maintained above room temperature and at 50° C. or less.

4. The substrate processing method of claim 1, wherein the reactive gas includes an inert gas together with the halogen-containing gas and does not include a hydrogen-containing gas.

5. The substrate processing method of claim 4, wherein the reactive gas includes $NF_3$ gas and Ar gas only.

6. The substrate processing method of claim 1, wherein, in the etching step, a gap distance between the gas distribution unit and the substrate support unit is greater than 25 mm.

7. The substrate processing method of claim 1, wherein, in the heating step, the temperature of the substrate support unit is controlled by heating a first heater provided in the substrate support unit and the temperature of the gas distribution unit is controlled by heating a second heater provided in the gas distribution unit.

* * * * *